(12) United States Patent
Tanabe

(10) Patent No.: US 11,644,517 B2
(45) Date of Patent: May 9, 2023

(54) MAGNETIC SENSOR

(71) Applicant: TDK CORPORATION, Tokyo (JP)

(72) Inventor: Kei Tanabe, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 17/569,194

(22) Filed: Jan. 5, 2022

(65) Prior Publication Data

US 2022/0128636 A1 Apr. 28, 2022

Related U.S. Application Data

(63) Continuation of application No. 16/079,944, filed as application No. PCT/JP2016/081107 on Oct. 20, 2016, now Pat. No. 11,249,149.

(30) Foreign Application Priority Data

Mar. 17, 2016 (JP) .................................. 2016-053521

(51) Int. Cl.
*G01R 33/09* (2006.01)
*H01L 43/08* (2006.01)
*G01R 33/02* (2006.01)
*G01B 7/00* (2006.01)
*G01R 33/00* (2006.01)

(52) U.S. Cl.
CPC ............ *G01R 33/09* (2013.01); *G01B 7/003* (2013.01); *G01R 33/0005* (2013.01); *G01R 33/02* (2013.01); *H01L 43/08* (2013.01)

(58) Field of Classification Search
CPC ..... G01R 33/09; G01R 33/0005; G01B 7/003
See application file for complete search history.

(56) References Cited

U.S. PATENT DOCUMENTS

| | | | |
|---|---|---|---|
| 2007/0069849 A1* | 3/2007 | Furukawa | G01R 33/093 338/32 R |
| 2010/0223797 A1* | 9/2010 | Peczalski | G01R 33/09 324/252 |
| 2012/0280677 A1* | 11/2012 | Furukawa | G01D 5/147 324/207.11 |
| 2015/0028863 A1* | 1/2015 | Zeyen | G01R 33/0011 29/602.1 |

(Continued)

*Primary Examiner* — Alvaro E Fortich
(74) *Attorney, Agent, or Firm* — Young Law Firm, P.C.

(57) ABSTRACT

An object of the present invention is to provide a magnetic sensor less subject to an environmental magnetic field. A magnetic sensor includes magnetic detection elements MR1 to MR4 positioned on a first plane P1 and a magnetic member 30A provided on a second plane P2. The magnetic member 30A includes first and second leg parts 41 and 42 and a first main body part 51 positioned between the first and second leg parts 41 and 42 so as to form a first space 61 between itself and the second plane P2. The magnetic detection elements MR1 to MR4 are covered with the first main body part 51. According to the present invention, magnetic field to be detected is collected to the first and second leg parts 41 and 42, and the magnetic detection elements MR1 to MR4 are covered with the first main body part 51, thereby allowing an environmental magnetic field acting as noise to bypass the magnetic detection elements MR1 to MR4 through the first main body part 51. Thus, influence of the environmental magnetic field can be reduced.

26 Claims, 11 Drawing Sheets

(56) References Cited

U.S. PATENT DOCUMENTS

2015/0177337 A1* 6/2015 Yamashita .............. H01L 43/08
   324/252
2016/0238670 A1* 8/2016 Shikama ................ H01L 43/08

* cited by examiner

MAGNETIC SENSOR

TECHNICAL FIELD

The present invention relates to a magnetic sensor and, more particularly, to a magnetic sensor provided with a magnetic member for collecting magnetic flux in a magnetic detection element.

BACKGROUND ART

A magnetic sensor using a magnetic resistance element is widely used in an ammeter, a magnetic encoder, and the like. The magnetic sensor is sometimes provided with a magnetic member for collecting magnetic flux in a magnetic detection element and, in this case, the magnetic member is disposed offset to the magnetic detection element (see Patent Documents 1 and 2). With this configuration, the direction of the magnetic flux is bent in a magnetism fixing direction by the magnetic member, thereby enabling high-sensitivity detection.

CITATION LIST

Patent Document

[Patent Document 1] Japanese Patent No. 5,500,785
[Patent Document 2] JP 2014-182096 A

SUMMARY OF INVENTION

Technical Problem to be Solved by Invention

However, in the magnetic sensor described in Patent Documents 1 and 2, a large part of the magnetic detection element is exposed from the magnetic member, so that the sensor is subject to an environmental magnetic field acting as noise.

It is therefore an object of the present invention to provide a magnetic sensor less subject to the environmental magnetic field.

Means for Solving Problem

A magnetic sensor according to the present invention includes a plurality of magnetic detection elements including at least a first magnetic detection element positioned on a first plane, and a magnetic member provided on a second plane parallel to the first plane. The magnetic member includes a first main body part forming a first space between itself and the second plane and a first leg part protruding from the first main body part and fixed to the second plane, and the first magnetic detection element is covered with the first main body part.

According to the present invention, a magnetic field to be detected is collected in the first leg part, and the first magnetic detection element is covered with the first main body part, thereby allowing an environmental magnetic field acting as noise to bypass the first magnetic detection element through the first main body part. Thus, influence of the environmental magnetic field can be reduced. The magnetic member is preferably made of a soft magnetic material.

Preferably, in the present invention, the plurality of magnetic detection elements further include a second magnetic detection element covered with the first main body part, the magnetic member further includes a second leg part protruding from the first main body part and fixed to the second plane, the first main body part is positioned between the first and second leg parts, the first magnetic detection element is disposed offset to the first leg part side, and the second magnetic detection element is disposed offset to the second leg part side. This allows magnetic fields collected in the first and second leg parts to be given to the first and second magnetic detection elements, respectively, so that a differential signal can be obtained. In addition, the first and second magnetic detection elements are sandwiched between the first and second leg parts in a plan view and covered with the first main body part, effectively preventing the environmental magnetic field from coming in the first space. Thus, influence of the environmental magnetic field can be reduced further.

In this case, the cross-sectional shape of the first space in a direction crossing the first and second planes and first and second leg parts may be polygonal, and the cross section of the bottom surface of the first main body part in a direction crossing the first and second planes and first and second leg parts may have a curved part.

Preferably, in the present invention, the plurality of magnetic detection elements further include a second magnetic detection element, the magnetic member further includes a second main body part forming a second space between itself and the second plane, the first leg part is positioned between the first and second main body parts, and the second magnetic detection element is covered with the second main body part. Also in this case, the differential signal can be obtained by the first and second magnetic detection elements.

Preferably, in this case, the magnetic member further includes second and third leg parts fixed to the second plane, the first main body part is positioned between the first and second leg parts, the second main body part is positioned between the first and third leg parts, and both the first and second magnetic detection elements are disposed offset to the first leg part side. As a result, the first magnetic detection element is sandwiched between the first and second leg parts in a plan view, and the second magnetic detection element is sandwiched between the first and third leg parts in a plan view, so that influence of the environmental magnetic field can be reduced further.

In the present invention, the first magnetic detection element is preferably disposed so as not to overlap the first leg part. This allows a larger number of magnetic field components parallel to the first plane to be applied to the first magnetic detection element.

Preferably, in the present invention, a first direction that is parallel to the first and second planes is set as the magnetization fixing direction of the plurality of magnetic detection elements, and the length of the magnetic member in a second direction parallel to the first and second planes and crossing the magnetization fixing direction is greater than the length of each of the plurality of magnetic detection elements in the second direction. This allows a magnetic field parallel to the magnetization fixing direction can be obtained over a wider area in the second direction, thereby making it possible to enhance the magnetic detection sensitivity of the magnetic sensor.

In the present invention, the plurality of magnetic detection elements are each preferably covered with the magnetic member. This allows a magnetic field to be detected to be efficiently given to the magnetic detection elements and allows the magnetic detection elements to be effectively shielded from the environmental magnetic field.

Advantageous Effects of Invention

According to the present invention, there can be provided a magnetic sensor capable of reducing influence of the environmental magnetic field.

MODE FOR CARRYING OUT THE INVENTION

Preferred embodiments of the present invention will now be explained in detail with reference to the drawings.

First Embodiment

Figure 1:
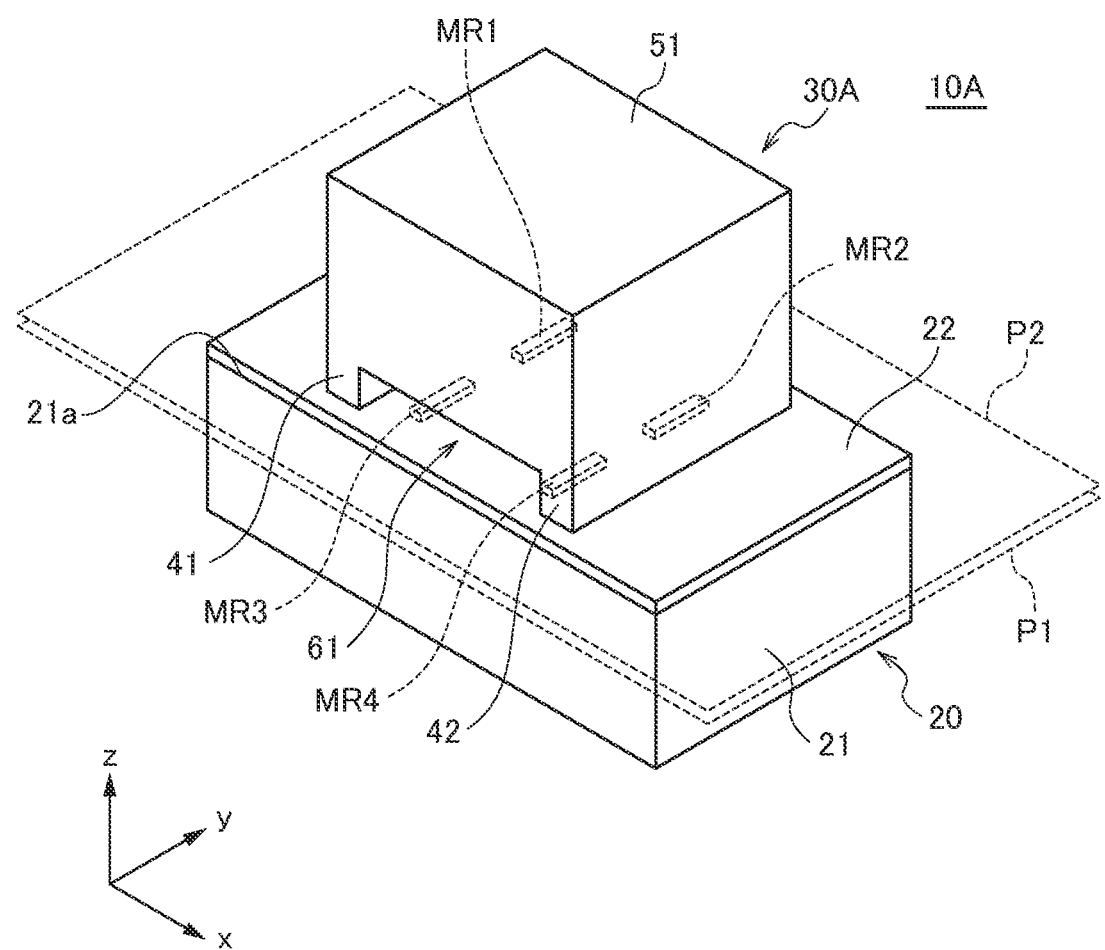
FIG. 1 is a schematic perspective view illustrating the outer appearance of a magnetic sensor 10A according to a first embodiment of the present invention.
Figure 2:
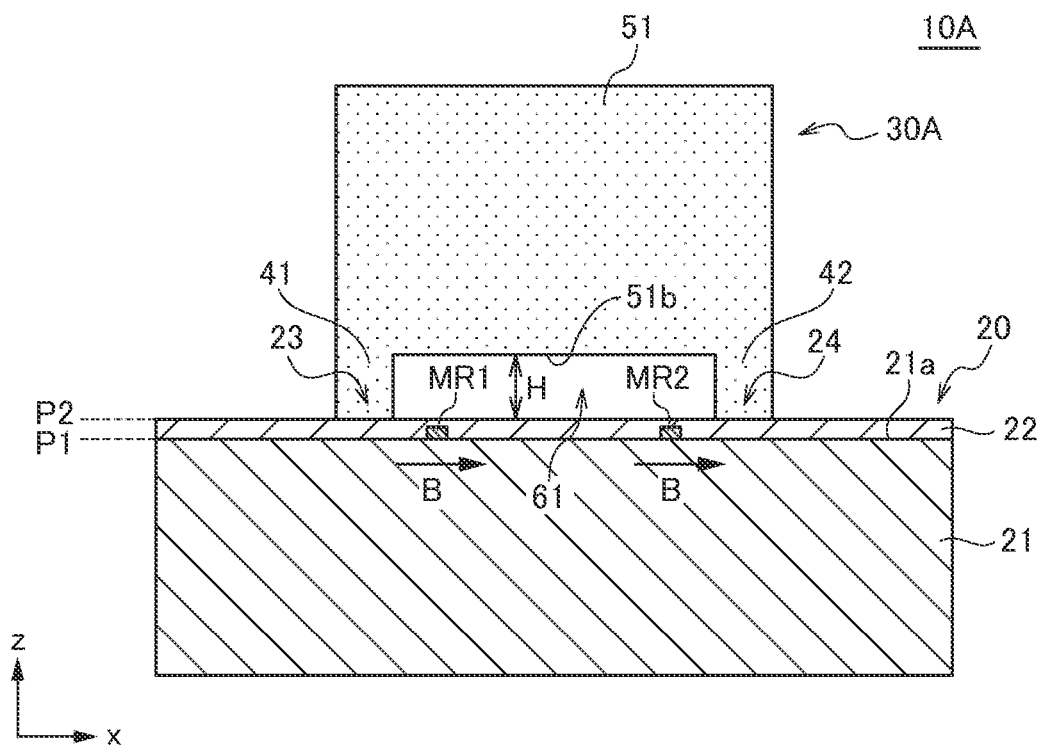
FIG. 2 is a cross-sectional view of the magnetic sensor 10A.
Figure 3:
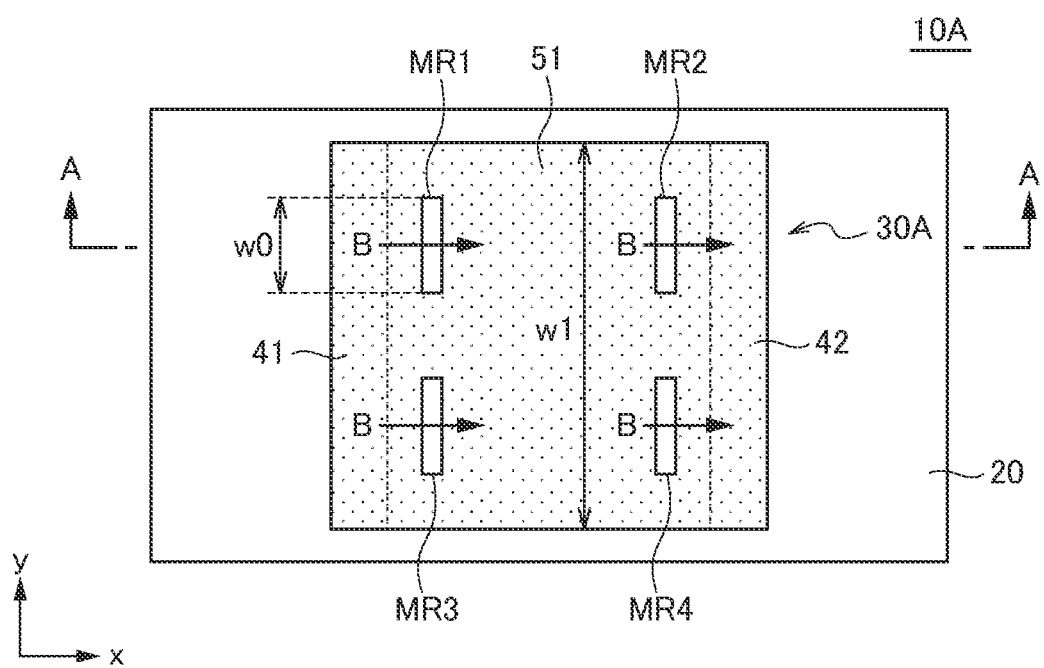
FIG. 3 is a top view of the magnetic sensor 10A.

FIG. 1 is a schematic perspective view illustrating the outer appearance of a magnetic sensor 10A according to the first embodiment of the present invention. FIG. 2 is a cross-sectional view of the magnetic sensor 10A, and FIG. 3 is a top view of the magnetic sensor 10A. In particular, FIG. 2 illustrates the cross section taken along line A-A of FIG. 3.

As illustrated in FIGS. 1 to 3, the magnetic sensor 10A according to the present embodiment includes a sensor chip 20, and a magnetic member 30A fixed to the sensor chip 20.

The sensor chip 20 has a substrate 21 having a substantially rectangular parallelepiped shape, and four magnetic detection elements MR1 to MR4 are formed on an element forming surface 21a of the substrate 21. The element forming surface 21a is an xy plane and constitutes a part of a first plane P1. The element forming surface 21a is covered with an insulating film 22, and the surface of the insulating film 22 constitutes a second plane P2 parallel to the first plane P1. A common method to produce the sensor chip 20 is to form a large number of sensor chips 20 on an aggregate substrate at a time and then to separate them for taking multiple sensor chips; however, the present invention is not limited to this, and the sensor chips 20 may be individually produced.

There is no particular restriction on the type of magnetic detection elements MR1 to MR4 as long as physical properties thereof are changed by magnetic flux density. In the present embodiment, a magnetoresistive element (MR element) whose electric resistance is changed in accordance with the direction of a magnetic field is used. The magnetization fixing directions of the magnetic detection elements MR1 to MR4 are all aligned in a first direction (positive side in the x-direction) denoted by arrows B in FIGS. 2 and 3.

The magnetic member 30A is a block made of a soft magnetic material, such as ferrite, having high permeability and is placed on the second plane P2. The magnetic member 30A has a first main body part 51 and first and second leg parts 41 and 42 protruding from the first main body part 51. The first leg part 41 is a part fixed to a mounting area 23 positioned on the second plane P2, and the second leg part 42 is a part fixed to a mounting area 24 positioned on the second plane P2. The first and second leg parts 41 and 42 can be fixed by using an adhesive. The magnetic detection elements MR1 and MR3 are disposed on the positive side in the x-direction with respect to the mounting area 23. Further, the magnetic detection elements MR2 and MR4 are disposed on the negative side in the x-direction with respect to the mounting area 24.

The first main body part 51 is positioned between the first leg part 41 and the second leg part 42, and a bottom surface 51b thereof is separated from the second plane P2 by a predetermined distance H. As a result, a first space 61 is formed between the second plane P2 and the first main body part 51. The first main body part 51 covers the magnetic detection elements MR1 to MR4 through the first space 61 in a plan view (when viewed in the z-direction). The magnetic detection elements MR1 and MR3 are disposed offset to the first leg part 41 side, and the magnetic detection elements MR2 and MR4 are disposed offset to the second leg part 42 side. That is, the magnetic detection elements MR1 and MR3 are disposed on the negative side in the x-direction with respect to the center of the magnetic member 30A in the x-direction, and the magnetic detection elements MR2 and MR4 are disposed on the positive side in the x-direction with respect to the center of the magnetic member 30A in the x-direction. The magnetic detection elements MR1 and MR3 are arranged in the y-direction that is a second direction, and the magnetic detection elements MR2 and MR4 are also arranged in the y-direction. Further, the magnetic detection elements MR1 and MR2 are arranged in the x-direction that is a first direction, and the magnetic detection elements MR3 and MR4 are also arranged in the x-direction.

The magnetic detection elements MR1 to MR4 are preferably entirely covered by the first main body part 51. In other words, the magnetic detection elements MR1 to MR4 do not preferably overlap the first leg part 41 or second leg part 42 at all in a plan view. This is because when a part of the magnetic detection element MR1, MR2, MR3, or MR4 overlaps the first leg part 41 or second leg part 42, an x-direction component of the magnetic flux given to the magnetic detection element MR1, MR2, MR3, or MR4 is reduced to degrade detection sensitivity by the reduction.

Figure 4:
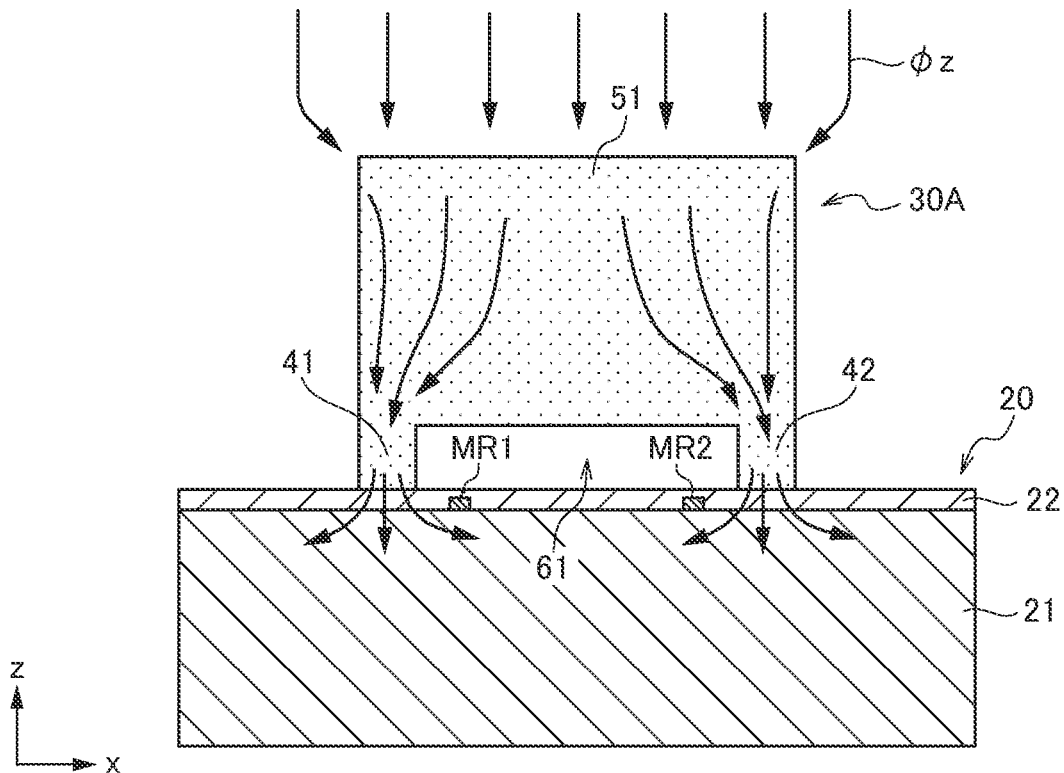
FIG. 4 is a schematic diagram for explaining a flow of magnetic flux $\phi z$ in the z-direction in the first embodiment.

As illustrated in FIG. 4, the magnetic member 30A plays a role of collecting magnetic flux φz in the z-direction and distributing half of it to the first leg part 41 and the remaining half to the second leg part 42. A part of the magnetic flux distributed to the first leg part 41 is bent to the positive side in the x-direction to be applied to the magnetic detection elements MR1 and MR3. A part of the magnetic flux distributed to the second leg part 42 is bent to the negative side in the x-direction to be applied to the magnetic detection elements MR2 and MR4. As a result, the magnetic flux given to the magnetic detection elements MR1, MR3 and the magnetic flux given to the magnetic detection elements MR2, MR4 are mutually in opposite directions. As described above, the magnetization fixing directions of the magnetic detection elements MR1 to MR4 are aligned in the positive x-direction denoted by arrows B, so that the magnetic detection elements MR1 to MR4 have sensitivity to a magnetic flux component in the x-direction.

Figure 5:
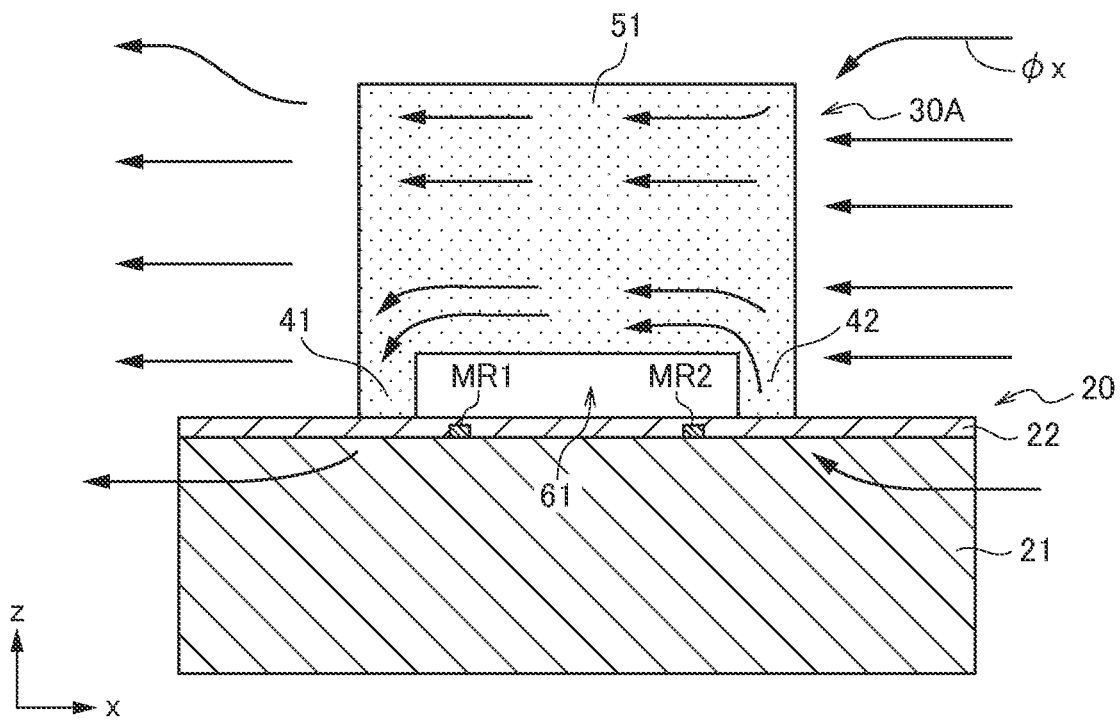
FIG. 5 is a schematic diagram for explaining a flow of magnetic flux $\phi x$ in the x-direction in the first embodiment.

On the other hand, as illustrated in FIG. 5, magnetic flux φx in the x-direction is absorbed into the first leg part 41 or second leg part 42 and is led to the first main body part 51. In the example of FIG. 5, the magnetic flux φx absorbed into the second leg part 42 is discharged from the first leg part 41 through the first main body part 51. As a result, the magnetic flux φx hardly comes in the first space 61 and, thus, influence that the magnetic flux φx has on the magnetic detection elements MR1 to MR4 becomes very small. As described above, the magnetic member 30A has a function of bringing the magnetic flux φx in the x-direction away from the magnetic detection elements MR1 to MR4, i.e., causing the magnetic flux φx to bypass the magnetic detection elements MR1 to MR4, so that influence of an environmental magnetic field acting as noise is significantly reduced.

Assuming that the length of each of the magnetic detection elements MR1 to MR4 in the y-direction is w0 and that the width of the magnetic member 30A in the y-direction is w1, w0<w1 is preferably satisfied. As a result, the magnetic flux bent in the x-direction by the magnetic member 30A covers a wider area of each of the magnetic detection elements MR1 to MR4 in the y-direction. That is, a magnetic field component in the x-direction can be obtained over the wider area in the y-direction, thereby enhancing magnetic detection sensitivity. In addition, a shield effect against an environmental magnetic field acting as noise which is brought about by the magnetic member 30A becomes wider in the y-direction, influence of the environmental magnetic field is reduced more effectively.

There is no particular restriction on the height of the magnetic member 30A in the z-direction; however, by increasing the height thereof in the z-direction, selectivity of the magnetic flux in the z-direction can be enhanced. In the present embodiment, the magnetic member 30A has the two leg parts 41 and 42 protruding from the bottom surface thereof, and the leg parts 41 and 42 are fixed to the second plane P2, so that even when the height of the magnetic member 30A in the z-direction is increased, the magnetic member 30A can be supported comparatively stably.

Figure 6:
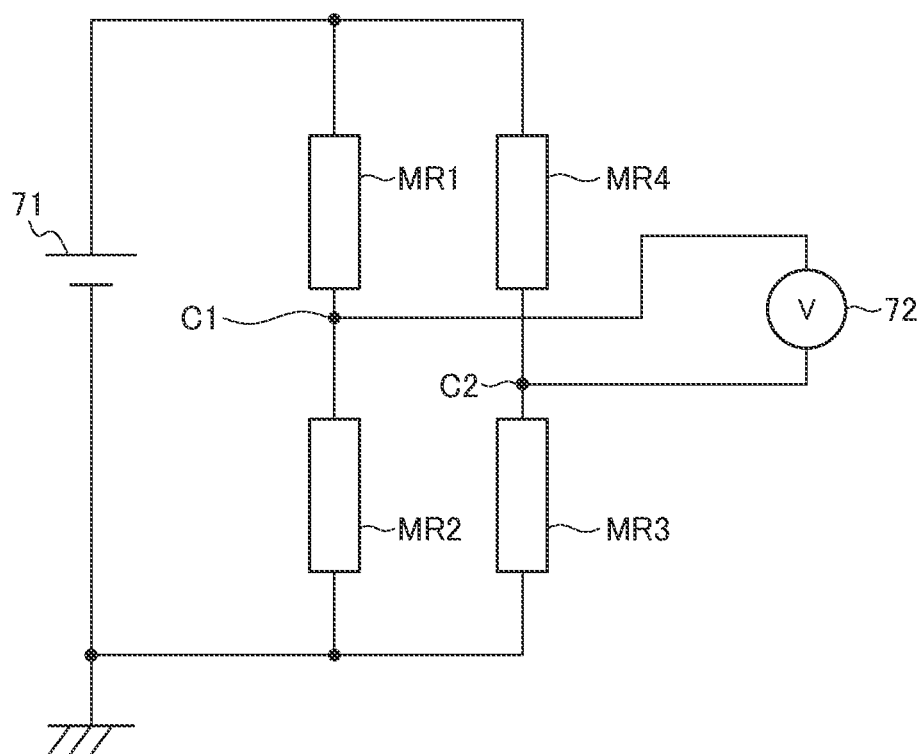
FIG. 6 is a circuit diagram for explaining the connection relationship between the magnetic detection elements MR1 to MR4.

FIG. 6 is a circuit diagram for explaining the connection relationship between the magnetic detection elements MR1 to MR4.

In the example of FIG. 6, a constant voltage source 71 is used. Between both ends of the constant voltage source 71, the magnetic detection elements MR1 and MR2 are connected in series in this order, and the magnetic detection elements MR4 and MR3 are connected in series in this order. A voltage detection circuit 72 is connected between a connection point C1 located between the magnetic detection elements MR1 and MR2 and a connection point C2 located between the magnetic detection elements MR4 and MR3, whereby the level of an output voltage appearing between the connection points C1 and C2 is detected.

The magnetic detection elements MR1 and MR3 are disposed offset to the first leg part 41 side in a plan view, and the magnetic detection elements MR2 and MR4 are disposed offset to the second leg part 42 side in a plan view, so that the magnetic detection elements MR1 to MR4 constitute a differential bridge circuit, making it possible to detect at high sensitivity an electric resistance change based on the magnetic flux density in each of the magnetic detection elements MR1 to MR4.

Specifically, the magnetic flux φz in the z-direction attracted to the magnetic member 30A is distributed to the mounting areas 23 and 24 of the sensor chip 20 and returned to the source of the magnetic flux after traveling on both sides in the x-direction. At this time, since the magnetic detection elements MR1 to MR4 have the same magnetization fixing direction, a difference occurs between the resistance change amounts of the magnetic detection elements MR1 and MR3 positioned on the positive side in the x-direction with respect to the mounting area 23 and the resistance change amounts of the magnetic detection elements MR2 and MR4 positioned on the negative side in the x-direction with respect to the mounting area 24. The difference is amplified twofold by the differential bridge circuit illustrated in FIG. 6 and detected by the voltage detection circuit 72.

As described using FIG. 5, in the magnetic sensor 10A according to the present embodiment, the magnetic flux φx in the x-direction which acts as noise passes through the magnetic member 30A and is hardly applied to the magnetic detection elements MR1 to MR4. That is, the magnetic member 30A has a shield effect against the magnetic flux φx in the x-direction, thus allowing significant reduction in the influence of the environmental magnetic field.

Further, the magnetic member 30A has the leg parts 41 and 42 on both sides thereof in the x-direction in a plan view, while it has no leg part on the both sides in the y-direction in a plan view. The reason for this is as follows. Since the magnetic detection elements MR1 to MR4 are elements having sensitivity to the magnetic flux in the x-direction, they need to be disposed adjacent to the leg parts 41 and 42 in the x-direction in a plan view, while when such leg parts are provided on the both sides in the y-direction, the magnetic flux φz in the z-direction to be detected flows in the leg parts to reduce a magnetic filed component to be detected. Thus, it is preferable not to provide the leg part on the both sides of the magnetic member 30A in the y-direction. In other words, the first space 61 is preferably opened on the both sides thereof in the y-direction.

Figure 7:
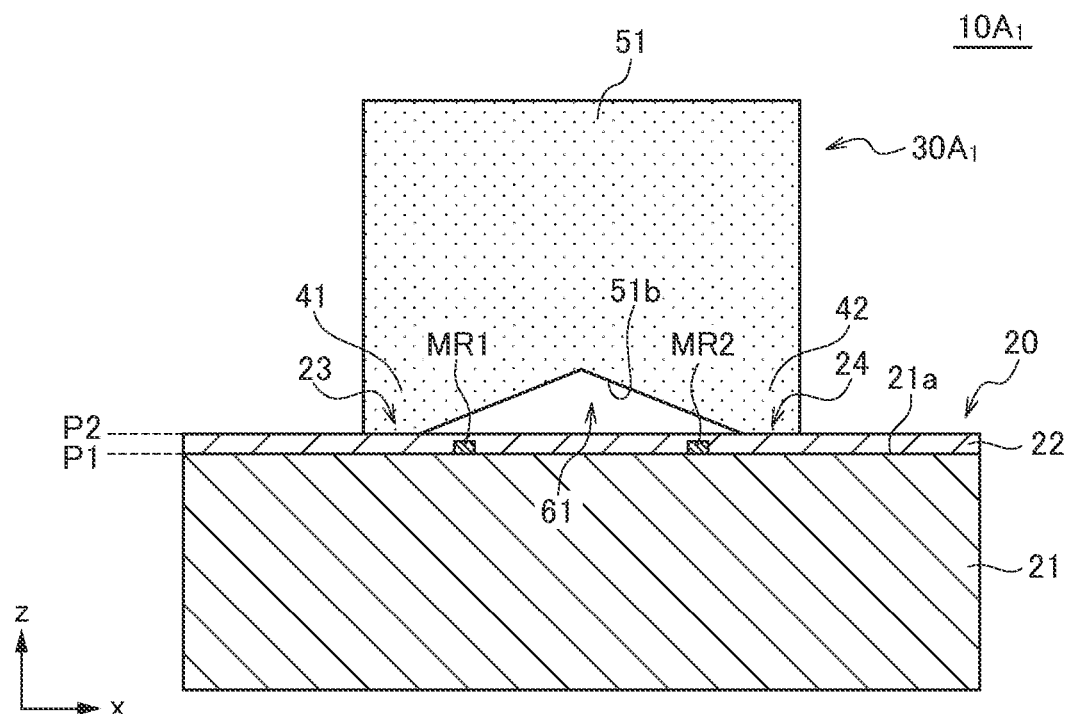
FIG. 7 is a cross-sectional view of the magnetic sensor $10A_1$ according to a first modification.

While the xz cross section of the first space 61 is rectangular in the above magnetic sensor 10A, the present invention is not limited to this. For example, like a magnetic sensor $10A_1$ according to a first modification illustrated in FIG. 7, it is possible to use a magnetic member $30A_1$ having an inclined bottom surface 51b of the first main body part 51 to make the xz cross section of the first space 61 triangular. This provides an advantage that, when a die is used to mold the magnetic member $30A_1$, the magnetic member $30A_1$ is easily removed from the die. The xz cross section of the first space 61 may have a polygonal shape other than the triangle or rectangle.

Figure 8:
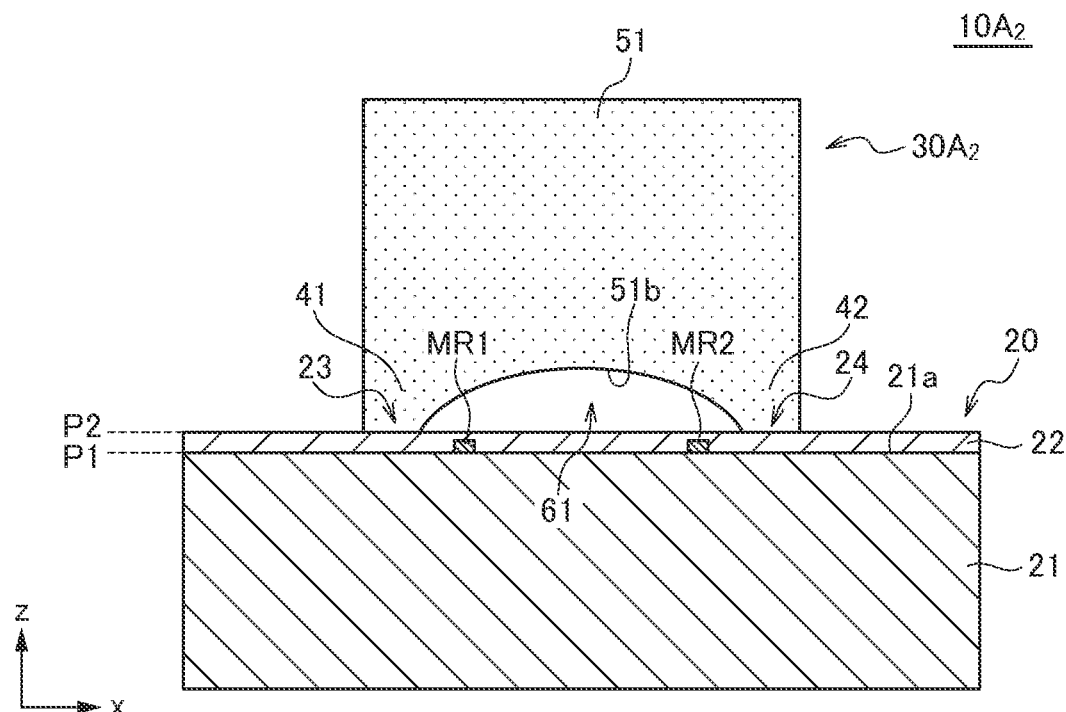
FIG. 8 is a cross-sectional view of the magnetic sensor $10A_2$ according to a second modification.

Further, like a magnetic sensor 10A$_2$ according to a second modification illustrated in FIG. 8, it is possible to bend the bottom surface 51*b* of the first main body part 51 into a circular arc shape or a bow-like shape to form a curved part. Accordingly, when a die is used to mold the magnetic member 30A$_2$, the magnetic member 30A$_2$ is removed from the die more easily. In this case, the entire bottom surface 51*b* may be formed into a curved shape, or a configuration may be possible in which a part of the bottom surface 51*b* is formed into a linear shape, and the remaining part is formed into a curved shape.

Second Embodiment

Figure 9:
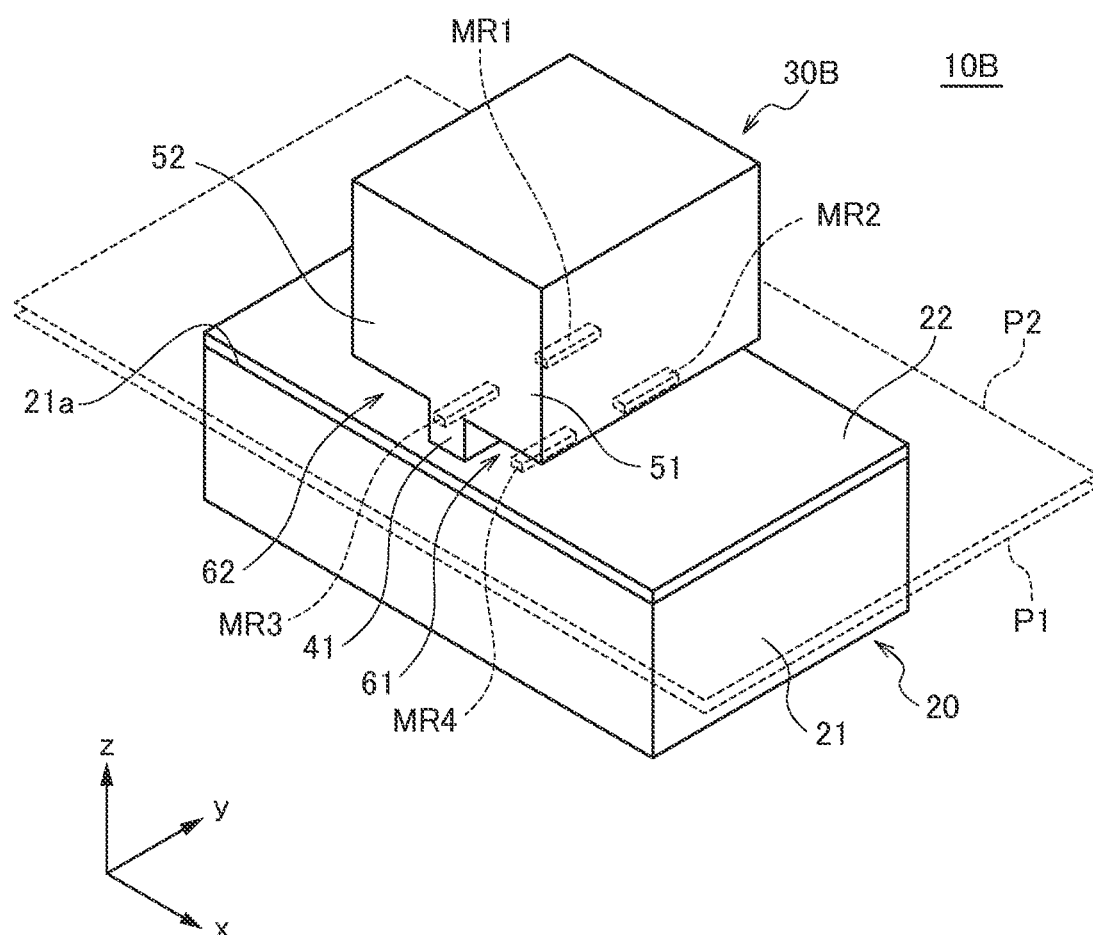
FIG. 9 is a schematic perspective view illustrating the outer appearance of a magnetic sensor 10B according to a second embodiment of the present invention.
Figure 10:
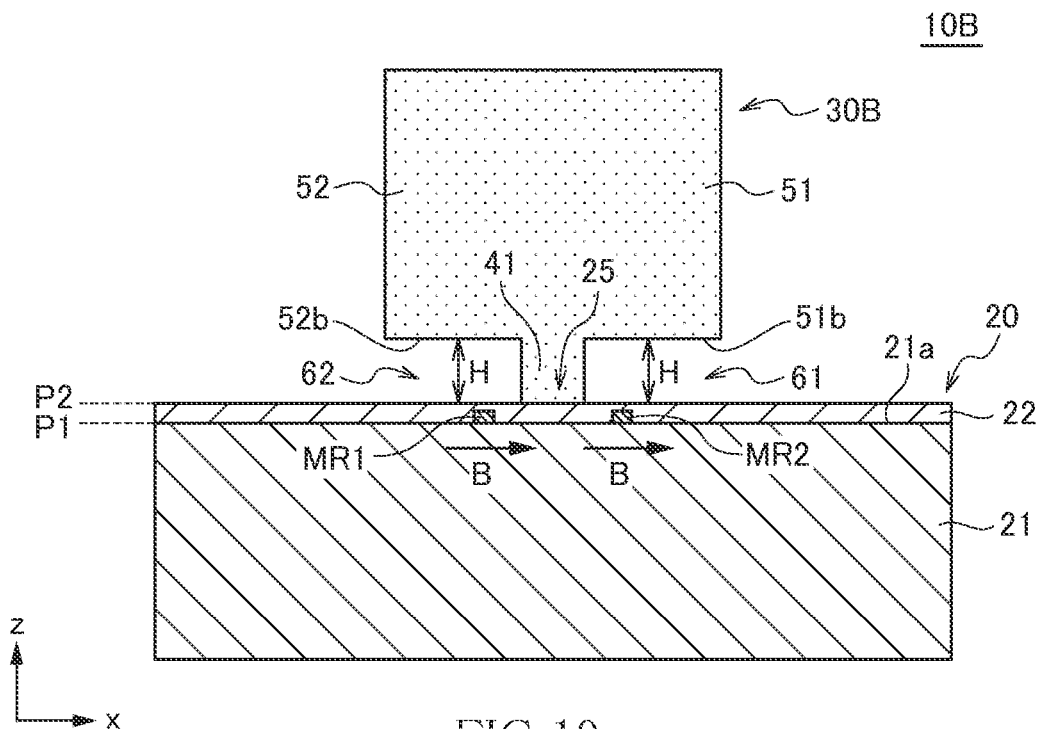
FIG. 10 is a cross-sectional view of the magnetic sensor 10B.
Figure 11:
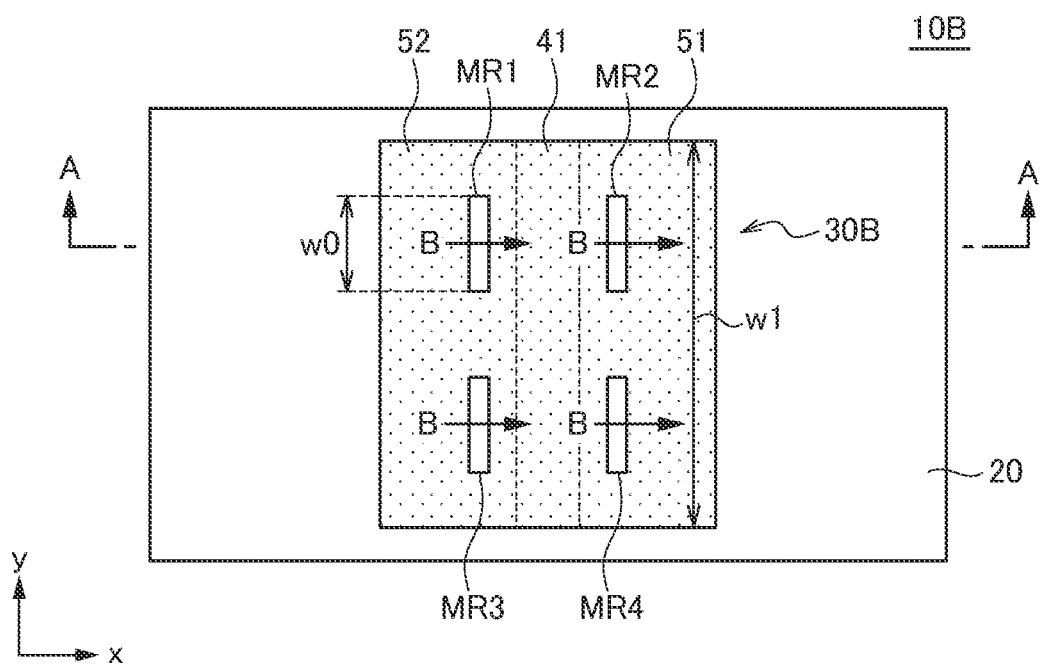
FIG. 11 is a top view of the magnetic sensor 10B.

FIG. 9 is a schematic perspective view illustrating the outer appearance of a magnetic sensor 10B according to the second embodiment of the present invention. FIG. 10 is a cross-sectional view of the magnetic sensor 10B, and FIG. 11 is a top view of the magnetic sensor 10B. In particular, FIG. 10 illustrates the cross section taken along line A-A of FIG. 11.

As illustrated in FIGS. 9 to 11, the magnetic sensor 10B according to the present embodiment differs from the magnetic sensor 10A according to the first embodiment in that a magnetic member 30B having a shape different from that of the magnetic member 30A is used in place of the magnetic member 30A. Other configurations are the same as those of the magnetic sensor 10A according to the first embodiment, so the same reference numerals are given to the same elements, and overlapping description will be omitted.

The magnetic member 30B has a first leg part 41 and first and second main body parts 51 and 52. The first leg part 41 is a part fixed to a mounting area 25 positioned on the second plane P2 and positioned between the first and second main body parts 51 and 52. The magnetic detection elements MR1 and MR3 are disposed on the negative side in the x-direction with respect to the mounting area 25, and the magnetic detection elements MR2 and MR4 are disposed on the positive side in the x-direction with respect to the mounting area 25.

The first main body part 51 is provided on the positive side in the x-direction of the first leg part 41, and a bottom surface 51*b* thereof is separated from the second plane P2 by a predetermined distance H. As a result, a first space 61 is formed between the second plane P2 and the first main body part 51. The first main body part 51 covers the magnetic detection elements MR2 and MR4 through the first space 61 in a plan view. The magnetic detection elements MR2 and MR4 are arranged in the y-direction along the first leg part 41.

The second main body part 52 is provided on the negative side in the x-direction of the first leg part 41, and a bottom surface 52*b* thereof is separated from the second plane P2 by a predetermined distance H. As a result, a second space 62 is formed between the second plane P2 and the second main body part 52. The second main body part 52 covers the magnetic detection elements MR1 and MR3 through the second space 62 in a plan view. The magnetic detection elements MR1 and MR3 are arranged in the y-direction along the first leg part 41.

Figure 12:
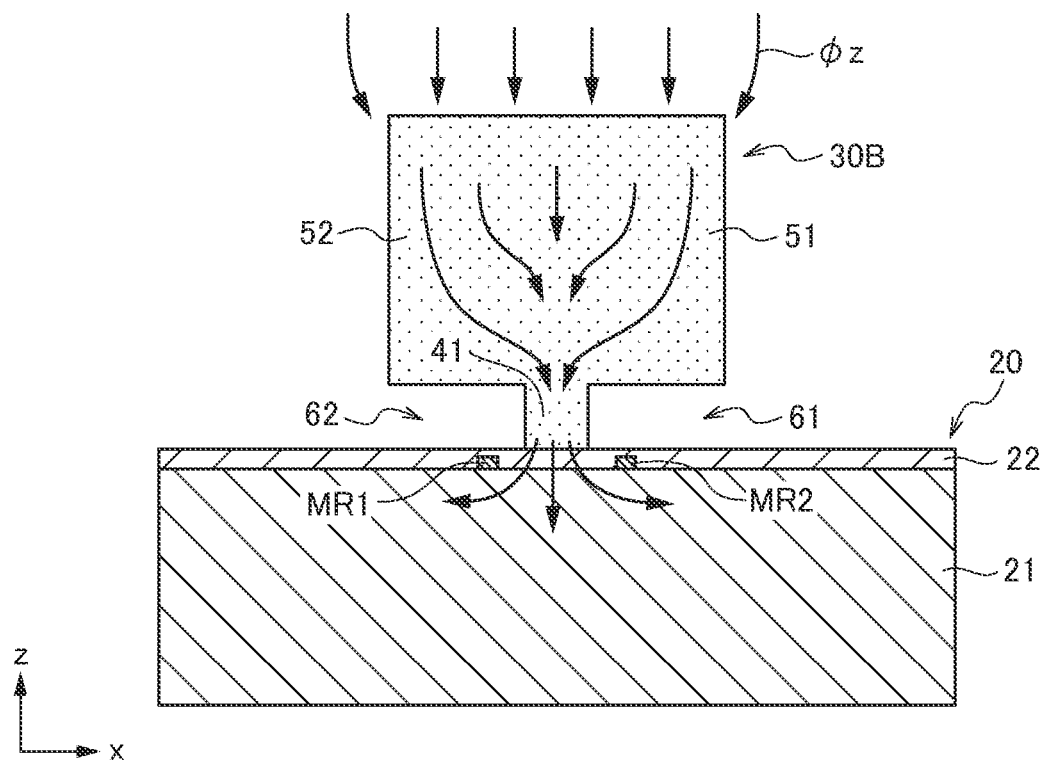
FIG. 12 is a schematic diagram for explaining a flow of magnetic flux $\phi z$ in the z-direction in the second embodiment.

As illustrated in FIG. 12, the magnetic member 30B plays a role of collecting the magnetic flux φz in the z-direction in the first leg part 41, bending a part of the collected magnetic flux φz to the negative side in the x-direction to discharge the same to the magnetic detection elements MR1 and MR3 side, and bending another part of the collected magnetic flux φz to the positive side in the x-direction to discharge the same to the magnetic detection elements MR2 and MR4 side. As a result, the magnetic flux given to the magnetic detection elements MR1, MR3 and the magnetic flux given to the magnetic detection elements MR2, MR4 are mutually in opposite directions, allowing the strength of the magnetic flux φz in the z-direction to be detected.

Figure 13:
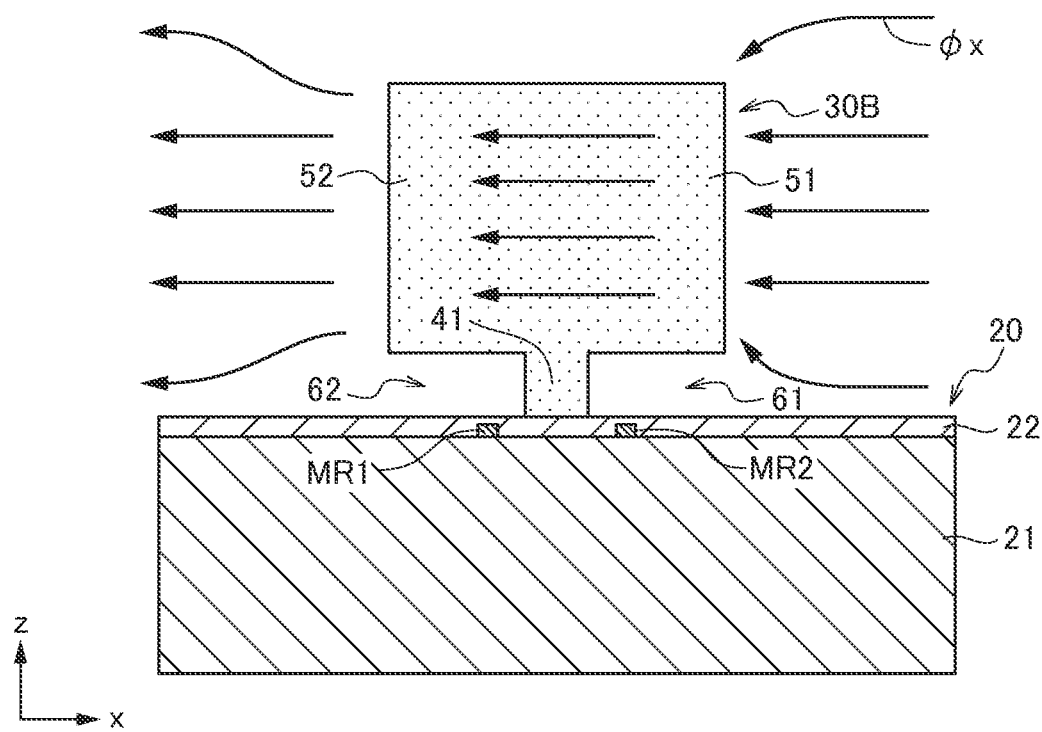
FIG. 13 is a schematic diagram for explaining a flow of magnetic flux $\phi x$ in the x-direction in the second embodiment.

On the other hand, as illustrated in FIG. 13, the magnetic flux φx in the x-direction which is a magnetism sensing direction is transmitted from one side of the first and second main body parts 51 and 52 to the other side thereof. As a result, the amount of magnetic flux φx to come into the first space 61 and the second space 62 is reduced, so that influence that the magnetic flux φx has on the magnetic detection elements MR1 to MR4 becomes small.

However, unlike the first embodiment, the first and second spaces 61 and 62 are not closed in the x-direction but are each opened at one side in the x-direction, so that the function of causing the magnetic flux φx in the x-direction to bypass the magnetic detection elements MR1 to MR4 is slightly reduced. However, in the present embodiment, the size of the magnetic member 30B in the x-direction is advantageously easily reduced. Further, the magnetic member 30B collects the magnetic flux φz in the z-direction in the first leg part 41, so that a signal level to be obtained is advantageously higher than that in the first embodiment.

Third Embodiment

Figure 14:
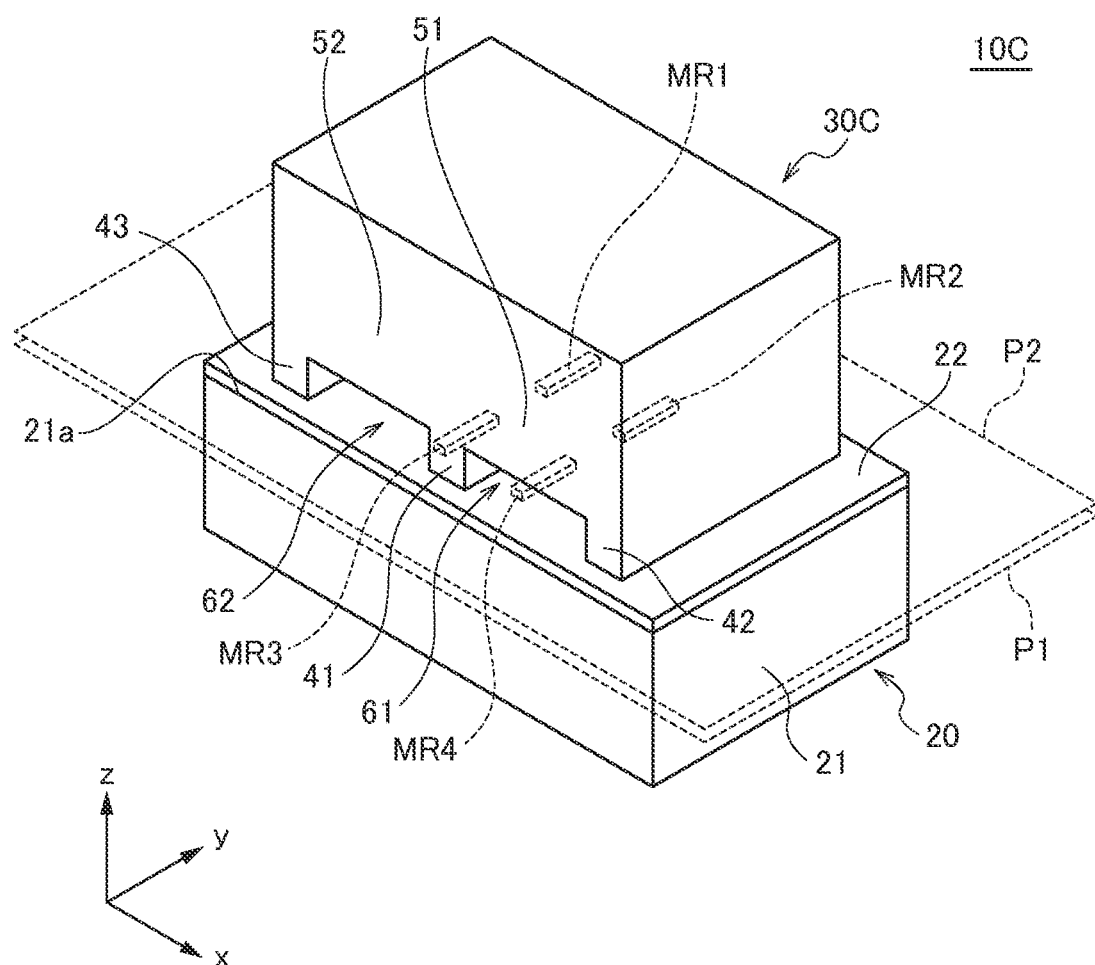
FIG. 14 is a schematic perspective view illustrating the outer appearance of a magnetic sensor 10C according to a third embodiment of the present invention.
Figure 15:
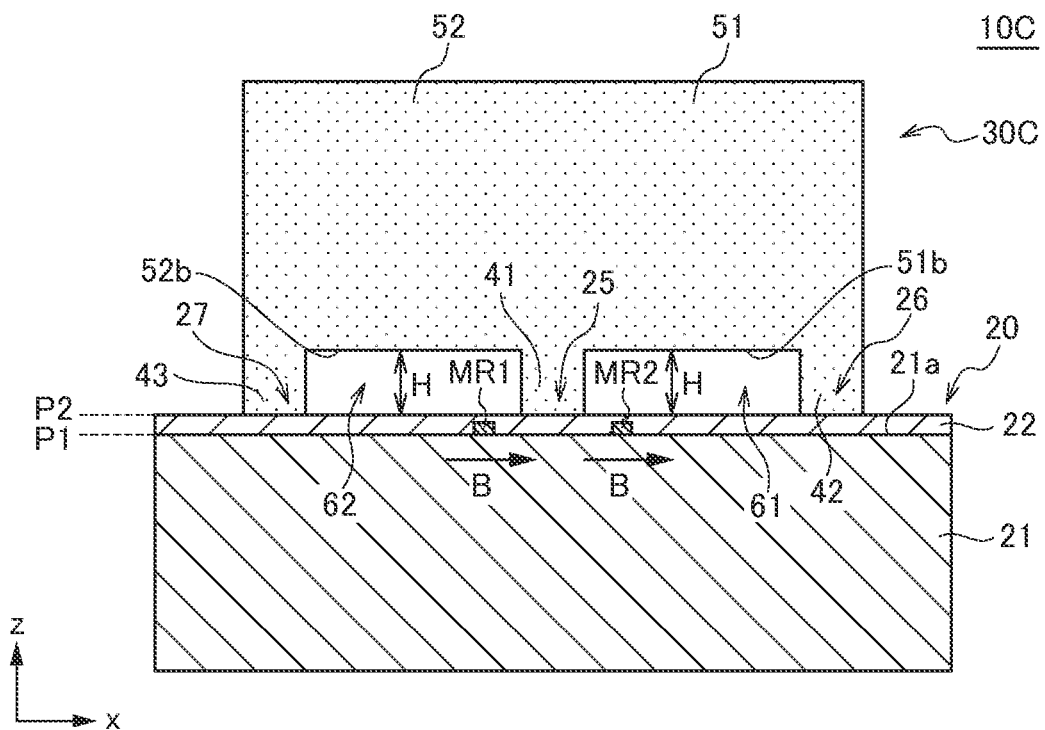
FIG. 15 is a cross-sectional view of the magnetic sensor 10C.
Figure 16:
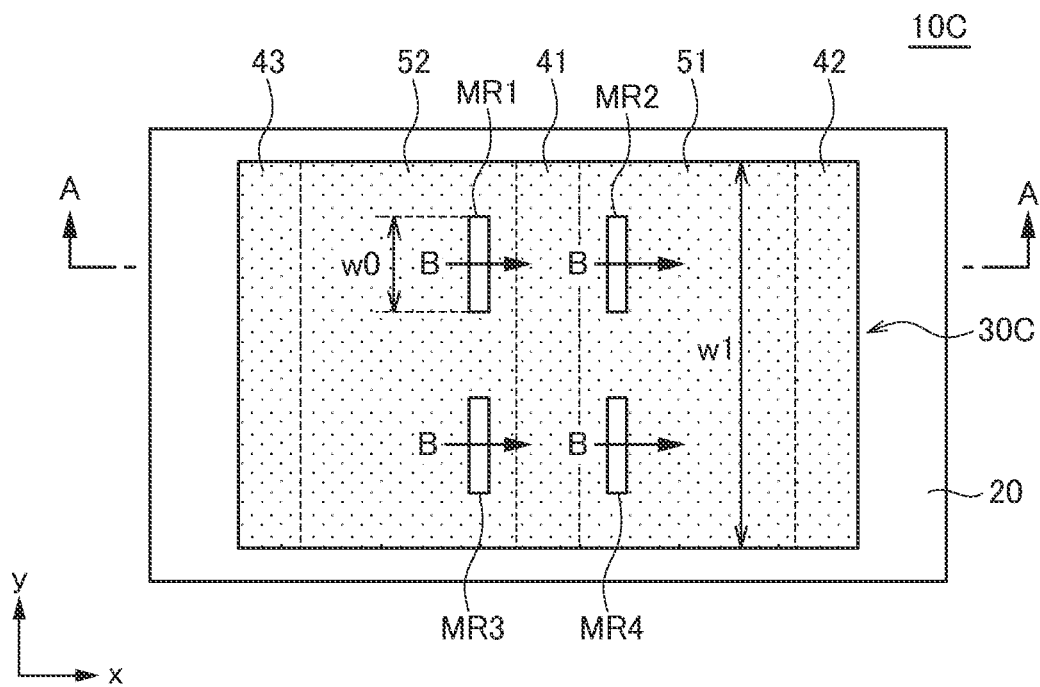
FIG. 16 is a top view of the magnetic sensor 10C.

FIG. 14 is a schematic perspective view illustrating the outer appearance of a magnetic sensor 10C according to the third embodiment of the present invention. FIG. 15 is a cross-sectional view of the magnetic sensor 10C, and FIG. 16 is a top view of the magnetic sensor 10C. In particular, FIG. 15 illustrates the cross section taken along line A-A of FIG. 16.

As illustrated in FIGS. 14 to 16, the magnetic sensor 10C according to the present embodiment differs from the magnetic sensors 10A and 10B according to the first and second embodiments in that a magnetic member 30C having a different shape from those of the magnetic members 30A and 30B is used in place of the magnetic members 30A and 30B. Other configurations are the same as those of the magnetic sensors 10A and 10B according to the first and second embodiments, so the same reference numerals are given to the same elements, and overlapping description will be omitted.

The magnetic member 30C has first to third leg parts 41 to 43 and first and second main body parts 51 and 52. The first to third leg parts 41 to 43 are parts fixed respectively to mounting areas 25 to 27 positioned on the second plane P2. The magnetic detection elements MR1 and MR3 are disposed on the negative side in the x-direction with respect to the mounting area 25, and the magnetic detection elements MR2 and MR4 are disposed on the positive side in the x-direction with respect to the mounting area 25.

The first main body part 51 is positioned between the first and second leg parts 41 and 42, and a bottom surface 51*b* thereof is separated from the second plane P2 by a predetermined distance H. As a result, a first space 61 is formed between the second plane P2 and the first main body part 51. The first main body part 51 covers the magnetic detection elements MR2 and MR4 through the first space 61 in a plan view. The magnetic detection elements MR2 and MR4 are arranged in the y-direction along the first leg part 41.

The second main body part 52 is positioned between the first and third leg parts 41 and 43, and a bottom surface 52b thereof is separated from the second plane P2 by a predetermined distance H. As a result, a second space 62 is formed between the second plane P2 and the second main body part 52. The second main body part 52 covers the magnetic detection elements MR1 and MR3 through the second space 62 in a plan view. The magnetic detection elements MR1 and MR3 are arranged in the y-direction along the first leg part 41.

Figure 17:
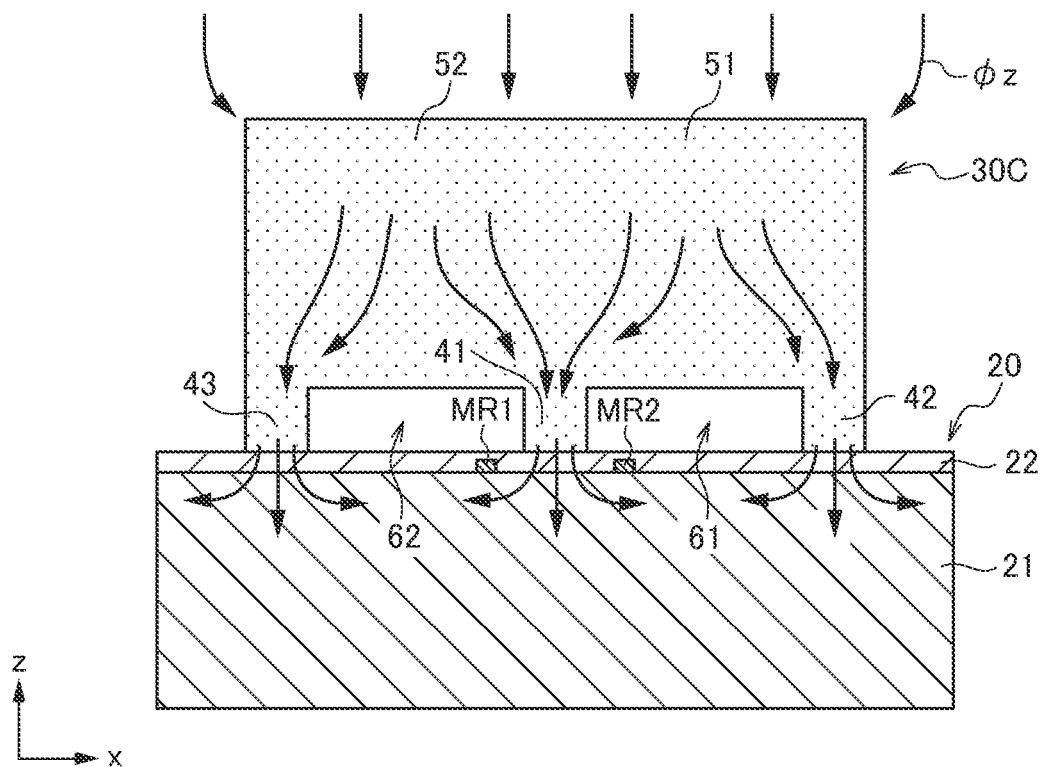
FIG. 17 is a schematic diagram for explaining a flow of magnetic flux $\phi z$ in the z-direction in the third embodiment.

As illustrated in FIG. 17, the magnetic member 30C collects the magnetic flux φz in the z-direction and leads a part of the collected magnetic flux φz to the first leg part 41. A part of the magnetic flux passing through the first leg part 41 is bent to the negative side in the x-direction to be discharged to the magnetic detection elements MR1 and MR3 side, and another part of the magnetic flux passing through the first leg part 41 is bent to the positive side in the x-direction to be discharged to the magnetic detection elements MR2 and MR4 side. As a result, the magnetic flux given to the magnetic detection elements MR1, MR3 and the magnetic flux given to the magnetic detection elements MR2, MR4 are mutually in opposite directions, allowing the strength of the magnetic flux φz in the z-direction to be detected.

Figure 18:
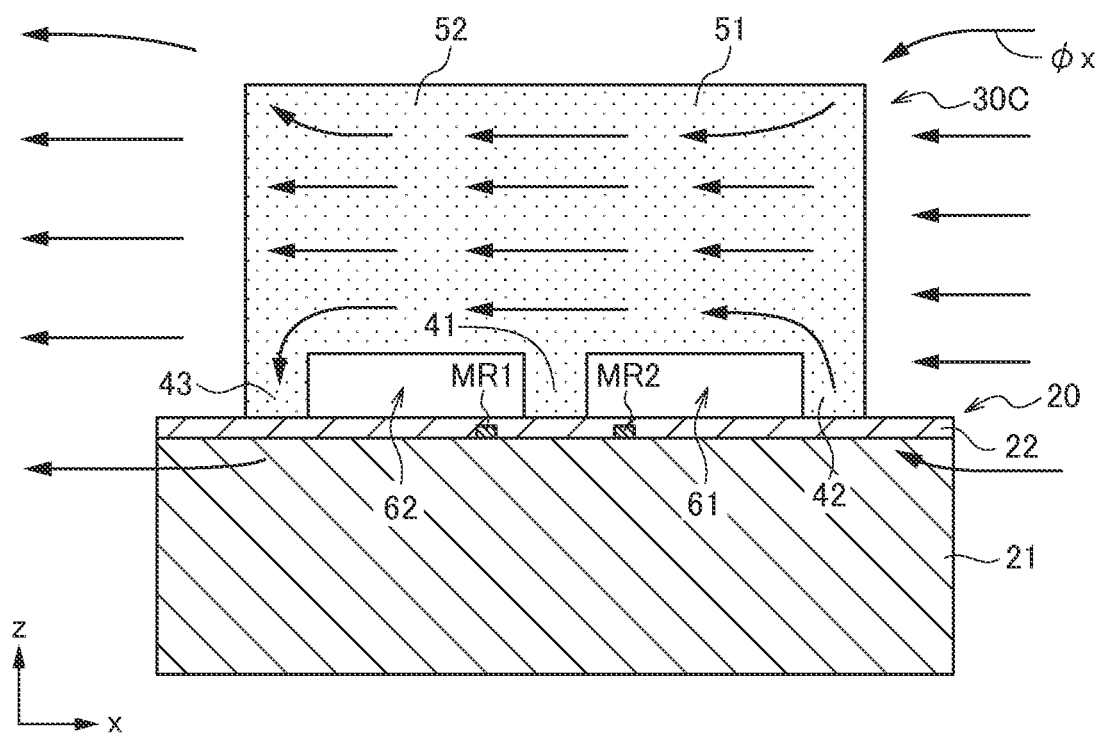
FIG. 18 is a schematic diagram for explaining a flow of magnetic flux $\phi x$ in the x-direction in the third embodiment.

On the other hand, as illustrated in FIG. 18, the magnetic flux φx in the x-direction which is a magnetism sensing direction is absorbed into the first leg part 41 or third leg part 43 and is led to the first main body part 51 or second main body part 52. In the example of FIG. 18, the magnetic flux φx absorbed into the second leg part 42 is discharged from the third leg part 43 through the first main body part 51, first leg part 41 and second main body part 52. As a result, the magnetic flux φx hardly comes into the first and second spaces 61 and 62 and, thus, influence that the magnetic flux φx has on the magnetic detection elements MR1 to MR4 becomes very small. As described above, the magnetic member 30C has a function of bringing the magnetic flux φx in the x-direction away from the magnetic detection elements MR1 to MR4, i.e., causing the magnetic flux φx to bypass the magnetic detection elements MR1 to MR4, so that influence of an environmental magnetic field acting as noise is significantly reduced.

It is apparent that the present invention is not limited to the above embodiments, but may be modified and changed without departing from the scope and spirit of the invention.

For example, while the four magnetoresistive elements (MR elements) are used as the magnetic detection element in the above embodiments, the type and number of the magnetic detection elements are not particularly limited.

Further, while the z-direction position of the first plane P1 on which the magnetic detection elements MR1 to MR4 are formed and the z-direction position of the second plane P2 to which the magnetic member 30A, 30B, or 30C is fixed differ from each other in the above embodiments, the first and second planes may be set in the same plane. That is, the magnetic member 30A, 30B, or 30C may be fixed to the first plane P1.

Further, the first and second spaces 61 and 62 each may not necessarily be completely hollow, but a nonmagnetic member may be filled in each of the first and second spaces 61 and 62.

REFERENCE SIGNS LIST 10A-10C, $10A_1$, $10A_2$ magnetic sensor
20 sensor chip
21 substrate
21a element forming surface
22 insulating film
23-27 mounting area
30A-30C, $30A_1$, $30A_2$ magnetic member
41 first leg part
42 second leg part
43 third leg part
51 first main body part
51b bottom surface of first main body part
52 second main body part
52b bottom surface of second main body part
61 first space
62 second space
71 constant voltage source
72 voltage detection circuit
C1, C2 connection point
MR1-MR4 magnetic detection element
P1 first plane
P2 second plane
φx magnetic flux in x-direction
φz magnetic flux in z-direction

What is claimed is:

1. A magnetic sensor comprising:
    a substrate having a surface extending in a first direction and a second direction perpendicular to the first direction;
    first and second magnetic detection elements formed on the surface of the substrate and arranged in the first direction; and
    a magnetic member including:
        a main body part facing the surface of the substrate so as to overlap the first and second magnetic detection elements in a third direction perpendicular to the first and second directions; and
        a leg part arranged between the surface of the substrate and the main body part,
    wherein the surface of the substrate has a first region sandwiched between the first and second magnetic detection elements in the first direction, and
    wherein the leg part of the magnetic member overlaps the first region of the surface of the substrate in the third direction.

2. The magnetic sensor as claimed in claim 1, wherein a size of the main body part in the second direction is greater than a size of the main body part in the first direction.

3. The magnetic sensor as claimed in claim 1, wherein a size of the main body part in the first direction is greater than a size of the main body part in the second direction.

4. The magnetic sensor as claimed in claim 1, wherein the main body part and the leg part are magnetically coupled to each other.

5. The magnetic sensor as claimed in claim 1, wherein the main body part and the leg part are integrated.

6. The magnetic sensor as claimed in claim 1, wherein a magnetization fixing direction of each of the first and second magnetic detection elements is the first direction.

7. The magnetic sensor as claimed in claim 1, wherein an upper surface of the main body part of the magnetic member positioned opposite to a lower surface on which the leg part is provided is substantially flat.

8. The magnetic sensor as claimed in claim 1, wherein a size of the leg part in the second direction is greater than a size of the leg part in the first direction.

9. The magnetic sensor as claimed in claim 1, wherein the leg part does not overlap the first and second magnetic detection elements as viewed from the first direction.

10. The magnetic sensor as claimed in claim 1, wherein a distance between the leg part and the first magnetic detection element in the first direction is a same as a distance between the leg part and the second magnetic detection element in the first direction.

11. The magnetic sensor as claimed in claim 1,
wherein the main body part has a first lower surface facing the first magnetic detection element and a second lower surface facing the second magnetic detection element, and
wherein the leg part is arranged between the first and second lower surfaces of the main body part in the first direction.

12. The magnetic sensor as claimed in claim 11, further comprising third and fourth magnetic detection elements formed on the surface of the substrate,
wherein the third and fourth magnetic detection elements are arranged in the first direction,
wherein the first and third magnetic detection elements are arranged in the second direction,
wherein the second and fourth magnetic detection elements are arranged in the second direction,
wherein the first lower surface of the main body part further faces the third magnetic detection element,
wherein the second lower surface of the main body part further faces the fourth magnetic detection element,
wherein the surface of the substrate further has a second region sandwiched between the third and fourth magnetic detection elements in the first direction, and
wherein the leg part of the magnetic member further overlaps the second region of the surface of the substrate in the third direction.

13. A magnetic sensor comprising:
a substrate having a surface extending in a first direction and a second direction perpendicular to the first direction;
first and second magnetic detection elements formed on the surface of the substrate and arranged in the first direction; and
a magnetic member including:
a main body part facing the surface of the substrate so as to overlap the first and second magnetic detection elements in a third direction perpendicular to the first and second directions; and
a leg part arranged between the surface of the substrate and the main body part so as to overlap a space between the first and second magnetic detection elements in the third direction,
wherein a size of the leg part in the second direction is greater than a size of the leg part in the first direction.

14. The magnetic sensor as claimed in claim 13, wherein a size of the main body part in the second direction is greater than a size of the main body part in the first direction.

15. The magnetic sensor as claimed in claim 13, wherein a size of the main body part in the first direction is greater than a size of the main body part in the second direction.

16. The magnetic sensor as claimed in claim 13, wherein the main body part and the leg part are magnetically coupled to each other.

17. The magnetic sensor as claimed in claim 13, wherein the main body part and the leg part are integrated.

18. The magnetic sensor as claimed in claim 13, wherein a magnetization fixing direction of each of the first and second magnetic detection elements is the first direction.

19. The magnetic sensor as claimed in claim 13, wherein an upper surface of the main body part of the magnetic member positioned opposite to a lower surface on which the leg part is provided is substantially flat.

20. A magnetic sensor comprising:
a substrate having a surface extending in a first direction and a second direction perpendicular to the first direction;
first and second magnetic detection elements formed on the surface of the substrate and arranged in the first direction; and
a magnetic member including:
a main body part facing the surface of the substrate so as to overlap the first and second magnetic detection elements in a third direction perpendicular to the first and second directions; and
a leg part arranged between the surface of the substrate and the main body part so as to overlap a space between the first and second magnetic detection elements in the third direction,
wherein the leg part does not overlap the first and second magnetic detection elements as viewed from the first direction.

21. The magnetic sensor as claimed in claim 20, wherein a size of the main body part in the second direction is greater than a size of the main body part in the first direction.

22. The magnetic sensor as claimed in claim 20, wherein a size of the main body part in the first direction is greater than a size of the main body part in the second direction.

23. The magnetic sensor as claimed in claim 20, wherein the main body part and the leg part are magnetically coupled to each other.

24. The magnetic sensor as claimed in claim 20, wherein the main body part and the leg part are integrated.

25. The magnetic sensor as claimed in claim 20, wherein a magnetization fixing direction of each of the first and second magnetic detection elements is the first direction.

26. The magnetic sensor as claimed in claim 20, wherein an upper surface of the main body part of the magnetic member positioned opposite to a lower surface on which the leg part is provided is substantially flat.

* * * * *